(12) United States Patent
Nicollini

(10) Patent No.: US 11,171,620 B2
(45) Date of Patent: Nov. 9, 2021

(54) INTERFACE CIRCUIT AND CORRESPONDING METHOD

(71) Applicant: STMicroelectronics S.r.l., Agrate Brianza (IT)

(72) Inventor: Germano Nicollini, Piacenza (IT)

(73) Assignee: STMicroelectronics S.r.l., Agrate Brianza (IT)

(*) Notice: Subject to any disclaimer, the term of this patent is extended or adjusted under 35 U.S.C. 154(b) by 45 days.

(21) Appl. No.: 16/785,831

(22) Filed: Feb. 10, 2020

(65) Prior Publication Data
US 2020/0259475 A1   Aug. 13, 2020

(30) Foreign Application Priority Data

Feb. 11, 2019 (IT) .......................... 102019000001913

(51) Int. Cl.
*H03F 3/45* (2006.01)

(52) U.S. Cl.
CPC .................... *H03F 3/45273* (2013.01); *H03F 2203/45151* (2013.01); *H03F 2203/45156* (2013.01)

(58) Field of Classification Search
CPC ....... H03F 3/45273; H03F 2203/45151; H03F 2203/45156; H03F 2203/45074; H03F 2203/45431; H03F 2203/45424; H03F 2203/45586; H03F 2203/45134; H03F 2203/45522; H03F 2203/45136; H03F 3/45632; H03F 3/245; H03F 3/45475; H03F 3/45071; H03F 3/45183; H03F 3/45085; H03F 1/34

USPC ................................... 330/25, 257, 260, 261
See application file for complete search history.

(56) References Cited

U.S. PATENT DOCUMENTS

| | | | |
|---|---|---|---|
| 8,816,766 B2* | 8/2014 | Igarashi | H03F 3/45071 330/69 |
| 9,729,126 B2* | 8/2017 | Guimaraes | H03F 1/086 |
| 10,382,079 B2* | 8/2019 | Alzaher | H03F 1/0205 |
| 2008/0157847 A1 | 7/2008 | Liu | |

(Continued)

FOREIGN PATENT DOCUMENTS

| EP | 0736968 A2 | 10/1996 |
|---|---|---|
| GB | 2344902 A | 6/2000 |

OTHER PUBLICATIONS

P. R. Gray and R. G. Meyer: "MOS Operational Amplifier Design—A Tutorial Overview", IEEE. JSSC, vo. 17, No. 6, pp. 969-982, Dec. 1982.

(Continued)

*Primary Examiner* — Khanh V Nguyen
(74) *Attorney, Agent, or Firm* — Crowe & Dunlevy

(57) ABSTRACT

A high-to-low voltage interface circuit includes a differential circuit stage with a differential amplifier circuit having inverting and non-inverting inputs coupled to first and second input pads as well as a differential output having first and second output nodes. A pair of bias amplifier stages sensitive to the common mode voltage of the differential amplifier circuit are arranged in first and second current mirror paths from the first and second input pads to the inverting/non-inverting inputs of the differential amplifier circuit, respectively. The bias amplifier stages are configured to maintain the first input pad and the second input pad of the differential circuit stage at the common mode voltage.

23 Claims, 3 Drawing Sheets

(56) References Cited

U.S. PATENT DOCUMENTS

| | | | |
|---|---|---|---|
| 2009/0058529 A1* | 3/2009 | Meninger | H03F 3/45636 330/261 |
| 2011/0140774 A1* | 6/2011 | Kaya | H03F 3/3022 330/124 R |
| 2013/0300503 A1 | 11/2013 | Hebert | |
| 2015/0249434 A1* | 9/2015 | Ogawa | G01R 27/02 73/504.02 |

OTHER PUBLICATIONS

Pickering, "Radar and Ultrasonic Sensors Strengthen ADAS Object Detection," www.electronicdesign.com, Aug. 2017, 6 pages.
IT Search Report and Written Opinion for IT Appl. No. 10-2019000001913 dated Oct. 8, 2019 (9 pages).

* cited by examiner

INTERFACE CIRCUIT AND CORRESPONDING METHOD

PRIORITY CLAIM

This application claims the priority benefit of Italian Application for Patent No. 102019000001913, filed on Feb. 11, 2019, the content of which is hereby incorporated by reference in its entirety to the maximum extent allowable by law.

TECHNICAL FIELD

The description relates to interface circuits.

One or more embodiments may be applied, for instance, to high-to-low voltage interface circuits.

One or more embodiments may be applied, for instance, to wireless power charger integrated circuits (ICs).

BACKGROUND

Robust and programmable interface circuits adapted to convert, for instance, high-voltage signals into low-voltage signals are desirable for various applications.

Being "robust" means that such a circuit is capable of withstanding high-voltage levels in the range of 70 V or more without this resulting in damage to a low-voltage section expected to operate in a voltage range of 1.8 V to 5 V, for instance.

Being "programmable" means that such an interface has a gain which can be programmed in a certain range, for instance a negative gain (attenuation) programmable in a range such as −20 dB to −40 dB.

Interface circuits as discussed herein may be used, for instance, in wireless power systems or object detection systems where the ability to determine when a friendly receiver is within an acceptable range of the transmitter before commencing power delivery represents a desirable feature.

Despite the fairly extensive activity in that area, further improved solutions are desirable. There is a need in the art to provide such an improved solution.

SUMMARY

According to one or more embodiments, an interface circuit and a corresponding method are presented.

One or more embodiments may offer various advantages such as, for instance:

high stability, with interface operation not directly related to an unknown and highly variable external capacitance of a circuit in the feedback loop, so that the presence of poles in the loop gain can be avoided, a robust arrangement is provided where the input stage of an amplifier representing the core of the interface is not directly connected to the input pads of the interface circuit, a (very) low impedance "seen" by the input current due to the presence of an active differential current mirror, with such an advantage applying both to differential and common mode currents, no strict constraints apply to the input (high) voltage.

In an embodiment, a circuit comprises: a differential input comprising a first input node and a second input node configured to receive an input signal therebetween; a differential circuit stage having a first input pad and a second input pad, the differential circuit stage comprising a fully differential amplifier circuit having a first input coupled to the first input pad, a second input coupled to the second input pad and a differential output comprising a first output node and a second output node configured to provide an output signal therebetween, the fully differential amplifier circuit having a common mode voltage; a pair of first resistors wherein each first resistor has a first resistance value, one of the first resistors arranged in a first current flow path from the first input node to the first input pad of the differential circuit stage and another of the first resistors arranged in a second current flow path from the second input node to the second input pad of the differential circuit stage; a pair of second resistors wherein each second resistor has a second resistance value, one of the second resistors arranged in a first feedback path from the first output node to the first input of the fully differential amplifier circuit and another of the second resistors arranges in a second feedback path from the second output node to the second input of the fully differential amplifier circuit; a pair of bias amplifier stages sensitive to the common mode voltage of the fully differential amplifier circuit, one of the bias amplifier stages arranged in a first current mirror path from the first input pad of the differential circuit stage to the first input of the fully differential amplifier circuit and another of the bias amplifier stages arranged in a second current mirror path from the second input pad of the differential circuit stage to the second input of the fully differential amplifier circuit, wherein said pair of bias amplifier stages are configured to maintain the first input pad and the second input pad of the differential circuit stage at the common mode voltage of the fully differential amplifier circuit.

In an embodiment, a circuit comprises: a fully differential amplifier circuit having a differential input comprising a first input and a second input, the differential amplifier circuit further having a common mode input configured to receive a common mode voltage, the fully differential amplifier circuit further having a differential output comprising a first output node and a second output node; a first bias amplifier stage having a first current path coupled between a first circuit input and a ground node, and a second current path coupled between the first input of the fully differential amplifier circuit and the ground node, wherein the first and second current paths are coupled in a first current mirror circuit controlled by a difference between a voltage at the first circuit input and the common mode voltage; and a second bias amplifier stage having a third current path coupled between a second circuit input and the ground node, and a fourth current path coupled between the second input of the fully differential amplifier circuit and the ground node, wherein the third and fourth current paths are coupled in a second current mirror circuit controlled by a difference between a voltage at the second circuit input and the common mode voltage.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 indicates as a whole an interface circuit configured to convert an input voltage signal $V_{HV\_sig}$ into an output voltage signal $V_{LV\_sig}$.

For instance, the circuit 10 may receive a ("high-voltage") input signal $V_{HV\_sig}$ in a range to 20 $V_{rms}$ to 50 $V_{rms}$ and convert it into a ("low voltage") output signal $V_{LV\_sig}$ in the range of 0.5 $V_{rms}$ to 2.0 $V_{rms}$, that is with the output signal $V_{LV\_sig}$ being a scaled-down or attenuated version of the input signal $V_{HV\_sig}$.

Of course, the values indicated above are merely exemplary and non-limiting.

As exemplified herein, the input signal $V_{HV\_sig}$ may be a differential voltage signal applied between a first (positive) input node $V_{HV\_sig\_P}$ and a second (negative) input node $V_{HV\_sig\_N}$.

Similarly, the output signal $V_{LV\_sig}$ as exemplified herein may be a differential voltage between a first (positive) output node $V_{LV\_sig\_P}$ and a second (negative) output node $V_{LV\_sig\_N}$.

It will be appreciated that throughout this description a same designation may be used for simplicity and ease of understanding to designate a certain circuit node or component (a resistor, for instance) as well as a signal occurring at that node/component.

Figure 1:
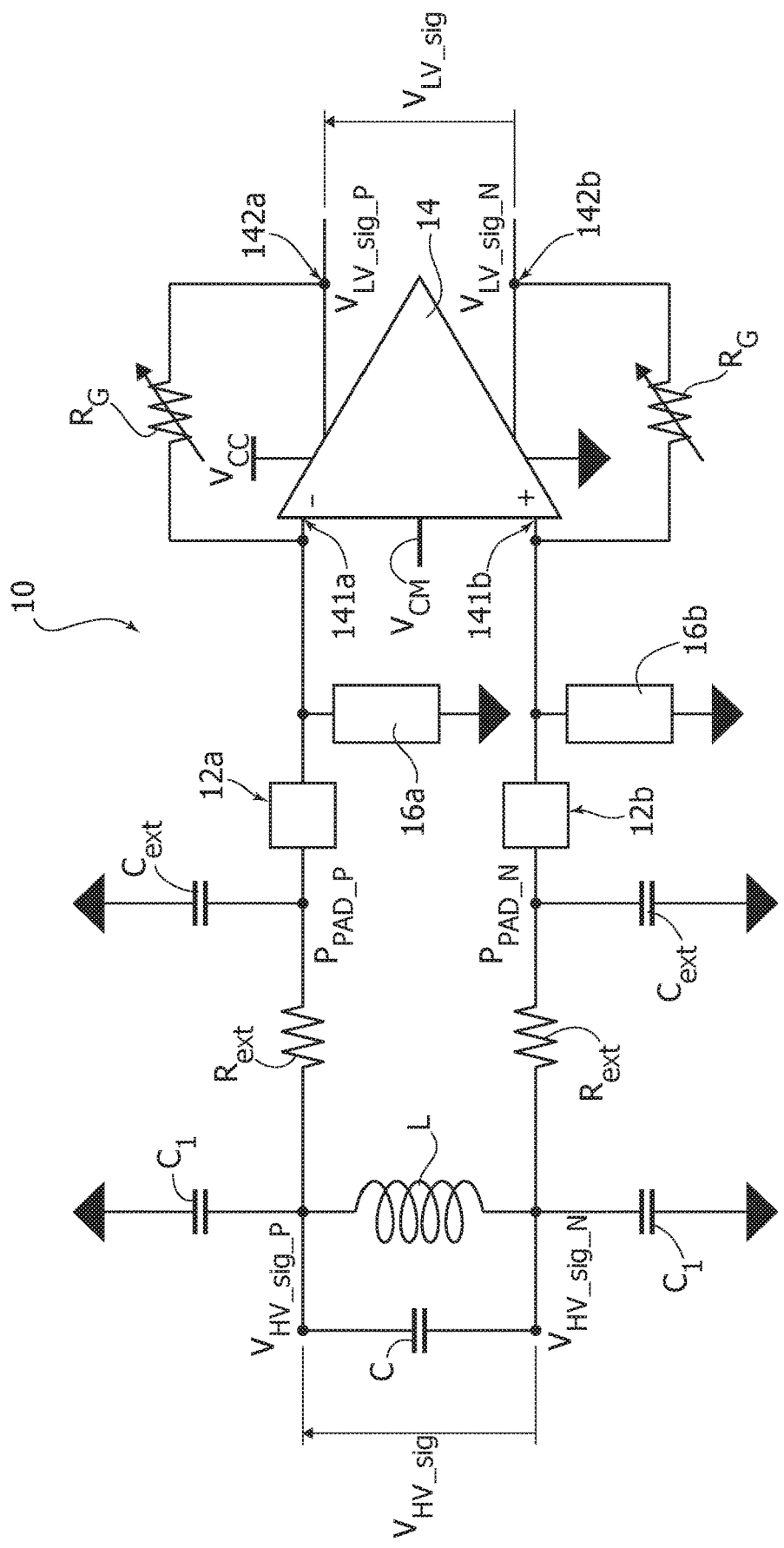
FIG. 1 is a circuit diagram of a voltage interface circuit.

In the exemplary case presented in FIG. 1 (and FIG. 2 as well) the input voltage $V_{HV\_sig}$ is exemplified as applied (or sensed) across an antenna equivalent resonant LC circuit including a capacitor C and an inductor L, with $C_{ext}$ exemplary of possible wiring/parasitic capacitances associated therewith.

It will be appreciated that such a representation is merely exemplary and is not to be construed, even indirectly, in a limiting sense of the embodiments.

In one or more embodiments, the differential input signal $V_{HV\_sig}$ is transferred towards the input pads 12a, 12b of a differential circuit stage comprising a fully differential amplifier 14 having a first input 141a (inverting, for instance) and a second input 141b (non-inverting, for instance).

The fully differential amplifier 14 also has a first output node 142a (positive, for instance) and a second output node 142b (negative, for instance) with the output voltage $V_{LV\_sig}$ available across the output nodes 142a, 142b.

As conventional in fully differential amplifiers, the difference of the output voltages (namely $V_{LV\_sig\_P} - V_{LV\_sig\_N} = V_{LV\_sig}$, that is the voltage between the output nodes 142a, 142b) is equal to the difference between the input voltages (that is the voltage between the input nodes 141a, 141b) multiplied by the gain of the fully differential amplifier 14.

The common mode voltage of the output voltages, namely $(V_{LV\_sig\_P} + V_{LV\_sig\_N})/2$ is not dependent on the input voltages. As exemplified herein, the common mode voltage $V_{CM}$ can be regarded as set directly by a third voltage input having a value close to half of the amplifier supply voltage $V_{CC}$.

Figure 2:
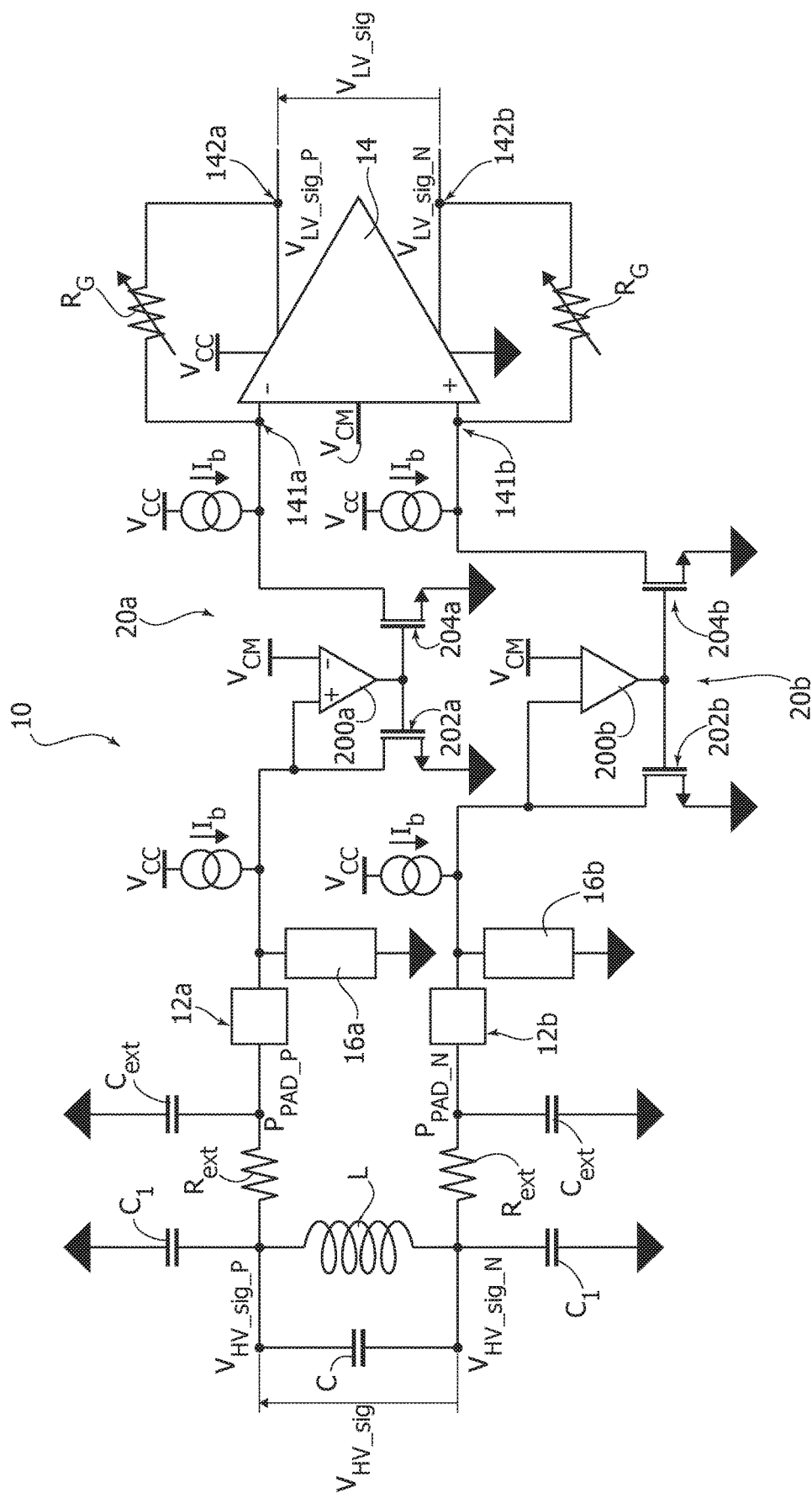
FIG. 2 is a circuit diagram of a voltage interface circuit.

As exemplified in FIGS. 1 and 2 two (large) external resistors $R_{ext}$ are arranged:
in a (first) current flow path or line between the input node $V_{HV\_sig\_P}$ and the input pad 12a, and
in a (second) current flow path or line between the input node $V_{HV\_sig\_N}$ and the input pad 12b.

These two resistors may have a (first) resistance value—designated for simplicity $R_{ext}$—and may convert the (high) differential voltage $V_{HV\_sig} = V_{HV\_sig\_P} - V_{HV\_sig\_N}$ into a differential current through the pads 12a, 12b.

The differential current thus produced can be converted into the differential voltage $V_{LV\_sig} = V_{LV\_sig\_P} - V_{LV\_sig\_N}$ at the output of the amplifier 14 thanks to two resistors $R_G$ in a second pair of resistors.

These two resistors may have a (second) resistance value—designated for simplicity $R_G$— and can be regarded as internal "trimmable" feedback resistors that are arranged:
between the first output 142a and the first input 141a of the amplifier 14, and
between the second output 142b and the second input 141b of the amplifier 14.

In the diagram of FIG. 1, references 16a and 16b indicate active clamp circuits (of a type known to those of skill in the art) acting at the pads 12a, 12b in order to clamp to ground undesirably high (voltage) levels present at the pads 12a, 12b for whatever reasons.

The input-output gain of a circuit 10 as exemplified in FIG. 1 can be expressed as $V_{LV\_sig}/V_{HV\_sig} = -R_G/R_{ext}$.

For instance with an amplifier 10 supplied at a voltage $V_{CC}$ in the range of 1.8 V to 5 V and a common mode voltage $V_{CM}$ in the range of 0.9 V to 2.5 V the resistance value of the "external" resistors $R_{ext}$ can be set in the range of hundred KOhm, 300 KOhm for instance, while the resistance value for the resistors $R_G$ can be set (for instance programmed or adjusted) from a few KOhm to tens of KOhm, from 3 KOhm to 30 KOhm, for instance.

An arrangement as exemplified in FIG. 1 may exhibit certain drawbacks related to a high sensitivity to stability problems. These may be related to the fact that, with the resistance value for the resistors $R_G$ being made variable, a certain $C_{ext}$ can be associated to the resistors $R_{ext}$ and pads 12a, 12b.

The value for $C_{ext}$ is generally unknown and may depend on various factors such as the application considered or the implementation of the board (as a printed circuit board or PCB, for instance). The value for $C_{ext}$ may thus lie in a range of 5 pF to 50 pF and give rise (in combination with resistance values for the resistors $R_G$ as discussed previously) to a pole in the loop gain at a frequency $f_{pole}$ given by:

$$f_{pole} = (1/2\pi) * (1/R_G C_{ext})$$

Such a pole does not necessarily lie at a high frequency (that is, a frequency higher than the unity-gain bandwidth of the amplifier 14). This makes cancellation or compensation of such a pole desirable in order to avoid instability problems.

A way of compensating such a pole may involve providing a left half-plane zero (very) close to the pole frequency.

This result can be obtained either by inserting a capacitor across the resistors $R_G$ in the feedback lines of the amplifier 14 or by exploiting a nulling resistor as possibly deriving from Miller compensation (see, for instance P. R. Gray and R. G. Meyer: "MOS Operational Amplifier Design—A Tutorial Overview", IEEE. JSSC, vo. 17, No. 6, pp. 969-982, December 1982, incorporated by reference).

The former approach considered in the foregoing reference may involve using a feedback capacitance of a (at least) one order of magnitude larger than the maximum expected value for $C_{ext}$ (50 pF, for instance), that is with a capacitance value of, say, 500 pF or more. This may result in a huge silicon area occupancy: the added capacitance would easily occupy a larger area than the whole circuit thus making such a solution hardly acceptable.

The latter approach considered in the foregoing may involve inserting a resistor in series with the Miller capacitor. Such a resistor should desirably be of the same type of $R_G$ in order to facilitate tracking of process and temperature variations in $R_G$, with the compensation resistor also made programmable together with $R_G$ in order to be able to track the value selected for $R_G$.

This may involve replicating a $R_G$ trimming around the nulling resistor with, again, a waste of area.

Additionally, such an approach will again suffer from the fact that $C_{ext}$ is unknown. The exact location of the pole at the frequency $f_{pole}$ being a priori unknown militates against a good or even just approximate zero compensation.

For instance, a satisfactory cancellation may be pursued with reference to a value for $C_{ext}$ more or less in the middle of the expected range of variation with however stability problems remaining for the values at the ends of the range.

In FIG. 2, parts, elements and/or signals like parts, elements and/or signals already discussed in the foregoing in connection with FIG. 1 are indicated with like reference symbols. Therefore, a corresponding detailed description will not be repeated for brevity.

In embodiments as exemplified in FIG. 2, a pair of bias amplifier circuits 20a and 20b are provided:
between the pad 12a and the first input 141a of the amplifier 14, and
between the pad 12b and the input 141b of the amplifier 14.

In embodiments as exemplified in FIG. 2, each one of the two bias amplifier stages 20a and 20b in turn includes a differential circuit 200a, 200b (an operational amplifier or OpAmp, for instance) having a first reference input (inverting, for instance) coupled to the common mode voltage $V_{CM}$ of the amplifier 14 and a second (non-inverting, for instance) input coupled to a respective one of the pads 12a, 12b.

In embodiments as exemplified in FIG. 2, the differential circuits (OpAmps, for simplicity) 200a, 200b drive via their output nodes respective pairs of transistors 202a, 204a and 202b, 204b exemplified herein in the form of MOSFET transistors.

In one or more embodiments as exemplified herein, the outputs from the differential circuits 200a, resp. 200b are coupled to the control electrodes or terminals (gates in the exemplary case of field-effect transistors such as MOSFET transistors) of the transistors 202a, 204a, respectively, 202b, 204b.

Also, the "first" transistor in each pair (namely the transistor 202a, respectively 202b) has a current path or channel therethrough (source-drain, in the case of field-effect transistors such as MOSFETs exemplified herein) coupled between the pad 12a, 12b and ground.

The "second" transistor in each pair (namely the transistors 204a, respectively 204b) is in turn coupled with a current path or channel therethrough (source-drain, in the case of field-effect transistors such as MOSFETs exemplified herein) coupled between the first input 141a of the amplifier 14 and ground, respectively, between the second input 141b of the amplifier 14 and ground.

In an arrangement as exemplified in FIG. 2, again the (external) resistors $R_{ext}$ convert a (high) differential voltage $V_{HV\_sig} = V_{VH\_sig\_P} - V_{HV\_sig\_N}$ into a differential current with the pad voltages $V_{PAD\_P}$ and $V_{PAD\_N}$ fixed to $V_{CM}$ by the bias amplifiers 200a, 200b.

At the same time, the bias amplifiers 200a, 200b also implement differential current mirrors (for instance two active n-channel current mirrors) together with current generators $I_b$ coupled between the supply voltage $V_{CC}$ and the pads 12a, 12b with the current $I_b$ mirrored in current lines between the supply terminal $V_{CC}$ and the inputs of the amplifier 14 to which the transistors 204a, 204b are coupled.

In one or more embodiments, the current generators providing the current $I_b$ may be implemented and configured—in a manner known to those of skill in the art—in order that the current $I_b$ may have an intensity higher (from 20% to 50% higher, for instance) than the highest (maximum) current expected to flow in the external resistors $R_{ext}$. This latter current may be expected to have an intensity in the range of 100 microA, for instance.

Again, the differential current is converted via the amplifier 14 into a differential output voltage $V_{LV\_sig} = V_{LV\_sig\_P} - V_{LV\_sig\_N}$ thanks to the feedback resistors $R_G$ with an input-output gain for an arrangement as exemplified in FIG. 2 again given by $$V_{LV\_sig}/V_{HV\_sig} = -R_G/R_{ext}$$

In an arrangement as exemplified in FIG. 2, the gain is again determined by the ratio of the resistance value of the feedback resistors $R_G$ of the amplifier 14 to the resistance value of the external resistors $R_{ext}$ with such ratio again adapted to be made adjustable/programmable and the pole in the loop gain moved in this case to a frequency:

$$f'_{pole} = (1/2\pi)*(1/R_G C_P)$$

where $C_P$ is the parasitic capacitance at the input nodes 141a, 141b of the amplifier 14 which is known and expectedly (very) low.

Consequently, the pole at the frequency $f'_{pole}$ will be located at a (very) high frequency, which avoids stability problems. Such a pole lies in fact out of the unity/gain bandwidth of the amplifier, which facilitates dispensing with any compensation and the drawbacks associated therewith.

Figure 3:
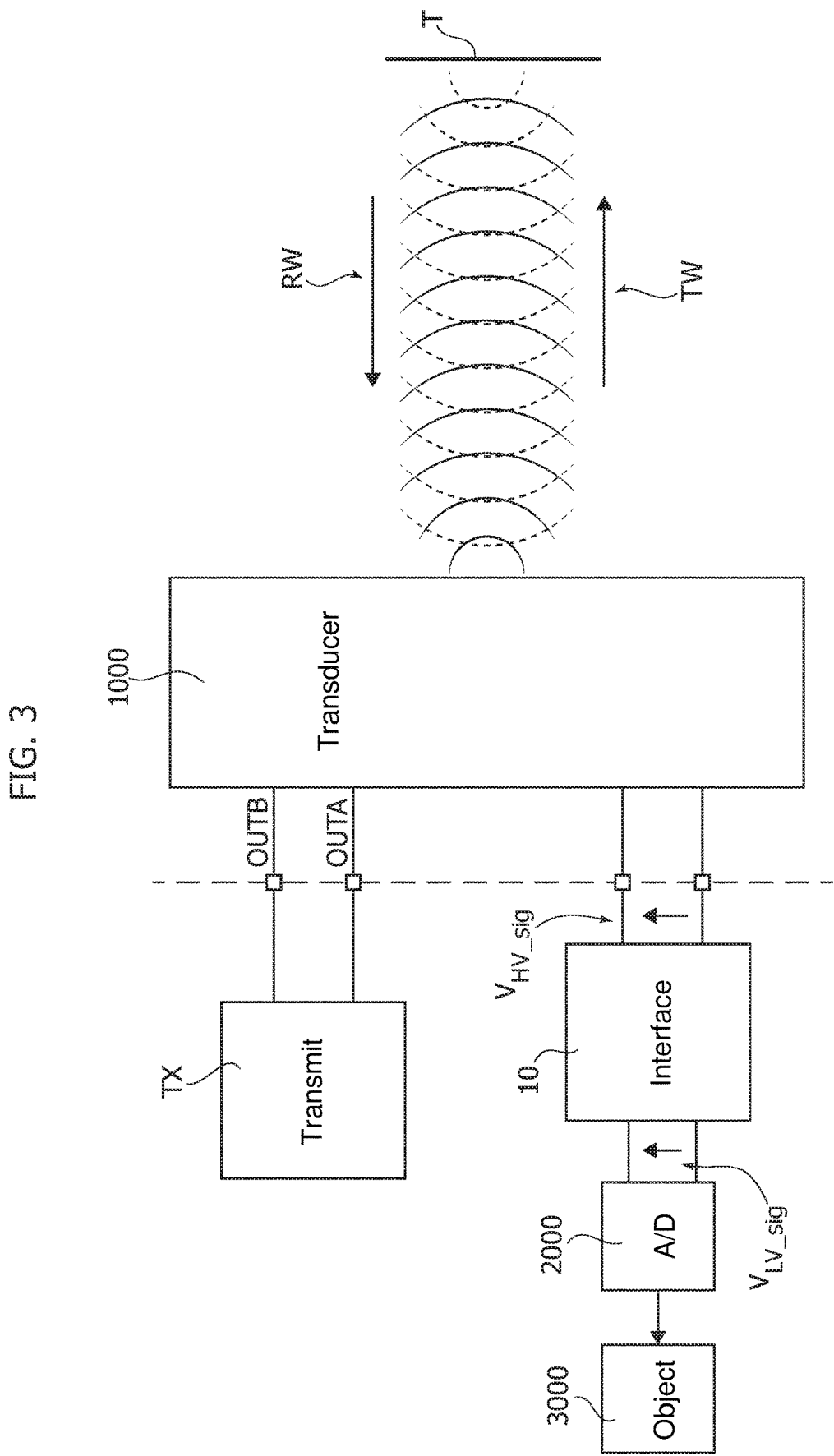
FIG. 3 is a block diagram exemplary of a device including a voltage interface circuit according to embodiments.

The block diagram of FIG. 3 is exemplary of a device which may include a circuit 10 as exemplified in the foregoing within the framework of an object detection system.

Such detection systems are increasingly considered for use in the automotive sector as exemplified, for instance in: Pickering, "Radar and Ultrasonic Sensors Strengthen ADAS Object Detection," www.electronicdesign.com, August, 2017.

Such a system as exemplified in FIG. 3 comprises an ultrasonic transducer 1000 driven by the outputs OUTA, OUTB of a transmitter TX.

The ultrasonic transducer 1000 can generate a transmitted wave TW expected to be reflected at a target T to be detected and sent back as a reflected wave RW.

The ultrasonic transducer 1000 may be configured (in a manner known to those of skill in the art) in such a way to act both as a transmission transducer to generate the transmitted wave, TW, and as a reception transducer to convert the reflected wave, RW, into an electrical reception signal applied as a high-voltage signal $V_{HV\_sig}$ at the input IN of an interface circuit 10 as discussed herein.

The low-voltage signal $V_{LV\_sig}$ output from the interface circuit 10 may be applied, as a low-voltage signal $V_{LV\_sig}$, to the input of a processing chain including, for instance:

an analog-to-digital (A/D) converter 2000, and
an object recognition circuit 3000.

Both the processing circuit 2000 and the object recognition circuit 3000 are adapted to be configured according to criteria known to those of skill in the art, thus making it unnecessary to provide a corresponding detailed description.

In a manner likewise known to those of skill in the art, the gain (attenuation) of the interface circuit 10 can be regulated, based on the relationship $V_{LV\_sig}/V_{HV\_sig}=-R_G/R_{ext}$ by acting on the resistors $R_G$.

In that way, the value of the resistors $R_G$ can be adjusted as a function of $V_{HV\_sig}$ (based on the relationship $V_{LV\_sig}/V_{HV\_sig}=-R_G/R_{ext}$) in order to maintain $V_{LV\_sig}$ within a "safe" range of operation of the circuitry 2000 (and 3000).

This may facilitate, for instance, making the interface circuit 10 "programmable" (e.g., by acting on the resistors $R_G$) with a gain which can be programmed in a certain range.

Similarly, embodiments as exemplified herein may be "robust" insofar as they may be capable of withstanding high-voltage levels in the range of 70 V or more, for instance, without this resulting in damage to a low-voltage section (see circuits 2000 and 3000 in FIG. 3, for instance).

A circuit (for instance, 10) as exemplified herein may comprise:
a differential input comprising a first input node (for instance, $V_{HV\_sig\_P}$) and a second input node (for instance, $V_{HV\_sig\_N}$) configured to receive an input signal (for instance, $V_{HV\_sig}$) therebetween,
a differential circuit stage, having a first input pad (for instance, 12a) and a second input pad (for instance, 12b), the differential circuit stage comprising a fully differential amplifier circuit (for instance, 14) having a first (for instance, inverting) input (for instance, 141a) coupled to the first input pad, a second (for instance, non-inverting) input (for instance, 141b) coupled to the second input pad as well as a differential output comprising a first output node (for instance $V_{LV\_sig\_P}$) and a second output node (for instance, $V_{LV\_sig\_N}$) configured to provide an output signal (for instance, $V_{LV\_sig}$) therebetween, the fully differential amplifier circuit having a common mode voltage (for instance, $V_{CM}$),
a first pair of resistors (for instance, $R_{ext}$) having a first resistance value, the resistors in the first pair of resistors arranged (the one) in a first current flow path from the first input node to the first input pad of the differential circuit stage and (the other) in a second current flow path from the second input node to the second input pad of the differential circuit stage, respectively,
a second pair of resistors (for instance, $R_G$) having a second resistance value, the resistors in the second pair of resistors arranged (the one) in a first feedback path from the first output node to the first input of the fully differential amplifier circuit and (the other) in a second feedback path from the second output node to the second input of the fully differential amplifier circuit, respectively,
wherein the circuit may comprise a pair of bias amplifier stages (for instance, 20a, 20b) sensitive to the common mode voltage (for instance, $V_{CM}$) of the fully differential amplifier circuit, the bias amplifier stages in the pair of bias amplifier stages arranged in a first current mirror path (for instance, 202a, 204a) from the first input pad the differential circuit stage to the first input of the fully differential amplifier circuit and in a second current mirror path (for instance, 202b, 204b) from the second input pad of the differential circuit stage to the second input of the fully differential amplifier circuit, respectively, wherein the bias amplifier stages in the pair of bias amplifier stages are configured to maintain the first input pad and the second input pad of the differential circuit stage at the common mode voltage of the fully differential amplifier circuit.

In a circuit as exemplified herein, the bias amplifier stages in the pair of bias amplifier stages may comprise respective differential circuits (for instance, 200a, 200b), said differential circuits having:
a reference input configured to sense the common mode voltage of the fully differential amplifier circuit;
a comparison input coupled to the first input pad, respectively the second input pad of the differential circuit stage; and
a bias output coupled (for instance, 204a, 204b) to the first input (inverting, for instance) respectively the second input (non-inverting, for instance) of the fully differential amplifier circuit.

In a circuit as exemplified herein the first current mirror path (for instance, 202a, 204a) and the second current mirror path (for instance, 202b, 204b) comprise respective first (for instance, 202a, 202b) and second (for instance, 204a, 204b) transistors having their control terminals jointly driven by a differential circuit in a respective bias amplifier stages in the pair of bias amplifier stages with:
the first transistor (for instance, 202a, 202b) having the current path therethrough coupled between the first input pad (for instance, 12a) of the differential circuit stage and ground, respectively the second input pad (for instance, 12b) of the differential circuit stage and ground; and
the second transistor having the current path therethrough coupled between the first input (for instance, 141a) of the fully differential amplifier circuit and ground, respectively the second input (for instance, 141b) of the fully differential amplifier circuit and ground.

In a circuit as exemplified herein, the resistors in the second pair of resistors may be variable resistors with a selectively variable second resistance value.

A circuit as exemplified herein may include active voltage clamps arranged between the first input pad (for instance, 12a) of the differential circuit stage and ground, respectively the second input pad (for instance, 12b) of the differential circuit stage and ground.

In a circuit as exemplified herein, the resistors in the first pair of resistors may have a first resistance value, the first resistance value higher than the second resistance value of the resistors in the second pair of resistors, wherein said output signal may be an attenuated version of the input signal.

In a circuit as exemplified herein:
the resistors in the first pair of resistors ($R_{ext}$) may be configured to be traversed by a current having a certain highest value,
the first current mirror path (for instance, 202a, 204a) and the second current mirror path (for instance, 202b, 204b) may be dimensioned to mirror a current ($I_b$) having a value higher, optionally 20% to 50% higher, than said certain highest value.

A device as exemplified herein may comprise:
a receiver circuit (for instance, 1000) configured to produce high-voltage signals,
signal processing circuitry (for instance, 2000, 3000) configured to operate on low-voltage signals,
a circuit as described above, the circuit having said differential input coupled to the receiver circuit and configured to receive high-voltage signals therefrom and said differential output coupled to said signal processing circuitry to provide low-voltage signals thereto.

A device as exemplified herein may comprise:
the receiver circuit configured to receive an object detection wave (for instance, RW) reflected from an object (for instance, T) and produce high-voltage signals as a function of the object detection wave received,
the signal processing circuitry comprising an object recognition circuit configured to recognize the object under detection as a function of low-voltage signals from the circuit.

A method of operating a circuit as exemplified herein or a device as exemplified herein may comprise at least one of:
selectively varying the ratio of said second resistance value to said first resistance value thereby varying the ratio of said output signal to said input signal, and/or
dimensioning the resistors in the first pair of resistors to be traversed by a current having a certain highest value and configuring the first current mirror path and the second current mirror path to mirror a current ($I_b$) having a value higher, optionally 20% to 50% higher, than said certain highest value.

Without prejudice to the underlying principles, the details and embodiments may vary, even significantly, with respect to what has been discussed by way of example only, without departing from the scope of protection.

The extent of protection is determined by the annexed claims.

The claims are an integral part of the disclosure of the embodiments as provided herein.

The invention claimed is:

1. A circuit, comprising:
a differential input comprising a first input node and a second input node configured to receive an input signal therebetween;
a differential circuit stage having a first input pad and a second input pad, the differential circuit stage comprising a fully differential amplifier circuit having a first input coupled to the first input pad, a second input coupled to the second input pad and a differential output comprising a first output node and a second output node configured to provide an output signal therebetween, the fully differential amplifier circuit having a common mode voltage;
a pair of first resistors wherein each first resistor has a first resistance value, one of the first resistors arranged in a first current flow path from the first input node to the first input pad of the differential circuit stage and another of the first resistors arranged in a second current flow path from the second input node to the second input pad of the differential circuit stage;
a pair of second resistors wherein each second resistor has a second resistance value, one of the second resistors arranged in a first feedback path from the first output node to the first input of the fully differential amplifier circuit and another of the second resistors arranges in a second feedback path from the second output node to the second input of the fully differential amplifier circuit; and
a pair of bias amplifier stages sensitive to the common mode voltage of the fully differential amplifier circuit, one of the bias amplifier stages arranged in a first current mirror path from the first input pad of the differential circuit stage to the first input of the fully differential amplifier circuit and another of the bias amplifier stages arranged in a second current mirror path from the second input pad of the differential circuit stage to the second input of the fully differential amplifier circuit, wherein said pair of bias amplifier stages are configured to maintain the first input pad and the second input pad of the differential circuit stage at the common mode voltage of the fully differential amplifier circuit.

2. The circuit of claim 1,
wherein said one bias amplifier stage comprises a differential circuit having:
a reference input configured to sense the common mode voltage of the fully differential amplifier circuit;
a comparison input coupled to the first input pad of the differential circuit stage; and
a bias output coupled to the first input of the fully differential amplifier circuit; and
wherein said another bias amplifier stage comprises a differential circuit having:
a reference input configured to sense the common mode voltage of the fully differential amplifier circuit;
a comparison input coupled to the second input pad of the differential circuit stage; and
a bias output coupled to the second input of the fully differential amplifier circuit.

3. The circuit of claim 1,
wherein the first current mirror path comprises respective first and second transistors having their control terminals jointly driven by a differential circuit in said one bias amplifier stage with:
the first transistor having a current path therethrough coupled between the first input pad of the differential circuit stage and ground; and
the second transistor having a current path therethrough coupled between the first input of the fully differential amplifier circuit and ground; and
wherein the second current mirror path comprises respective first and second transistors having their control terminals jointly driven by a differential circuit in said one another bias amplifier stage with:
the first transistor having a current path therethrough coupled between the second input pad of the differential circuit stage and ground; and
the second transistor having a current path therethrough coupled between the second input of the fully differential amplifier circuit and ground.

4. The circuit of claim 1, wherein the second resistors are variable resistors with a selectively variable second resistance value.

5. The circuit of claim 1, further comprising:
a first active voltage clamp arranged between the first input pad of the differential circuit stage and ground; and
a second active voltage clamp arranged between the second input pad of the differential circuit stage and ground.

6. The circuit of claim 1, wherein the first resistors have a first resistance value which is higher than a second resistance value of the second resistors, wherein said output signal is an attenuated version of the input signal.

7. The circuit of claim 6, wherein a ratio of said second resistance value to said first resistance value is selectively varied to thereby varying a ratio of said output signal to said input signal.

8. The circuit of claim 1, wherein:
the first resistors are configured to be traversed by a current having a certain highest value; and
the first current mirror path and the second current mirror path are dimensioned to mirror a current having a value higher than said certain highest value.

9. The circuit of claim 8, wherein the value higher is 20% to 50% higher than said certain highest value.

10. The circuit of claim 1, further comprising:
a receiver circuit configured to produce a high-voltage signal differential signal which is applied to the first and second input nodes;
wherein a low-voltage differential signal is generated at the differential output formed by the first and second output nodes; and
signal processing circuitry configured to operate on the low-voltage differential signal.

11. The circuit of claim 10:
wherein the receiver circuit is configured to receive an object detection wave reflected from an object under detection and produce the high-voltage differential signal as a function of the received object detection wave; and
wherein the signal processing circuitry comprises an object recognition circuit configured to recognize the object under detection as a function of low-voltage differential signal.

12. A circuit, comprising:
a fully differential amplifier circuit having a differential input comprising a first input and a second input, the differential amplifier circuit further having a common mode input configured to receive a common mode voltage, the fully differential amplifier circuit further having a differential output comprising a first output node and a second output node;
a first bias amplifier stage having a first current path coupled between a first circuit input and a ground node, and a second current path coupled between the first input of the fully differential amplifier circuit and the ground node, wherein the first and second current paths are coupled in a first current mirror circuit controlled by a difference between a voltage at the first circuit input and the common mode voltage; and
a second bias amplifier stage having a third current path coupled between a second circuit input and the ground node, and a fourth current path coupled between the second input of the fully differential amplifier circuit and the ground node, wherein the third and fourth current paths are coupled in a second current mirror circuit controlled by a difference between a voltage at the second circuit input and the common mode voltage.

13. The circuit of claim 12, further comprising:
a first current source configured to source a first current to the first input of the fully differential amplifier circuit; and
a second current source configured to source a second current to the second input of the fully differential amplifier circuit;
wherein the first and second currents have a same magnitude.

14. The circuit of claim 12, further comprising:
a first current source configured to source a first current to the first input of the fully differential amplifier circuit; and
a second current source configured to source a second current to the first circuit input;
wherein the first and second currents have a same magnitude.

15. The circuit of claim 12, further comprising:
a first current source configured to source a first current to the first current path;
a second current source configured to source a second current to the second current path;
a third current source configured to source a third current to the third current path; and
a fourth current source configured to source a fourth current to the fourth current path;
wherein the first, second, third and fourth currents have a same magnitude.

16. The circuit of claim 12, wherein the first current mirror circuit comprises:
a first transistor in the first current path;
a second transistor in the second current path; and
a first amplifier circuit having a first input coupled to the first current path, a second input coupled to receive the common mode voltage and an output generating a signal driving control terminals of the first and second transistors.

17. The circuit of claim 12, wherein the second current mirror circuit comprises:
a third transistor in the third current path;
a fourth transistor in the fourth current path; and
a second amplifier circuit having a first input coupled to the third current path, a second input coupled to receive the common mode voltage and an output generating a signal driving control terminals of the third and fourth transistors.

18. The circuit of claim 12, further comprising:
a receiver circuit configured to produce a high-voltage signal differential signal which is applied to the first and second circuit inputs;
wherein a low-voltage differential signal is generated at the differential output formed by the first and second output nodes; and
signal processing circuitry configured to operate on the low-voltage differential signal.

19. The circuit of claim 18:
wherein the receiver circuit is configured to receive an object detection wave reflected from an object under detection and produce the high-voltage differential signal as a function of the received object detection wave; and
wherein the signal processing circuitry comprises an object recognition circuit configured to recognize the object under detection as a function of low-voltage differential signal.

20. The circuit of claim 12, further comprising a receiver circuit configured to receive an input differential signal and generate an output differential signal which is applied to the first and second circuit inputs, wherein the receiver circuit comprises:
an inductor coupled between first and second nodes receiving the input differential signal;
a first resistor coupled between the first node and the first circuit input; and
a second coupled between the second node and the second circuit input.

21. The circuit of claim 20, wherein the receiver circuit further comprises:
   a first capacitor coupled between the first node and a reference node; and
   a second capacitor coupled between the second node and the reference node.

22. The circuit of claim 20, wherein the receiver circuit further comprises:
   a first capacitor coupled between the first circuit input and a reference node; and
   a second capacitor coupled between the second circuit input and the reference node.

23. The circuit of claim 20, wherein the receiver circuit further comprises:
   a first clamp circuit coupled between the first circuit input and a reference node; and
   a second clamp circuit coupled between the second circuit input and the reference node.

* * * * *

UNITED STATES PATENT AND TRADEMARK OFFICE
CERTIFICATE OF CORRECTION

| | |
|---|---|
| PATENT NO. | : 11,171,620 B2 |
| APPLICATION NO. | : 16/785831 |
| DATED | : November 9, 2021 |
| INVENTOR(S) | : Germano Nicollini |

It is certified that error appears in the above-identified patent and that said Letters Patent is hereby corrected as shown below:

In the Claims

At Column 10, Claim No. 3, Line 49, please delete the word "one".

Signed and Sealed this
Third Day of September, 2024

Katherine Kelly Vidal
*Director of the United States Patent and Trademark Office*